(12) United States Patent
Pickerd

(10) Patent No.: US 8,788,234 B2
(45) Date of Patent: Jul. 22, 2014

(54) METHOD OF CALIBRATING INTERLEAVED DIGITIZER CHANNELS

(75) Inventor: John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 846 days.

(21) Appl. No.: 12/905,611

(22) Filed: Oct. 15, 2010

(65) Prior Publication Data

US 2012/0095713 A1    Apr. 19, 2012

(51) Int. Cl.
G06F 15/00 (2006.01)

(52) U.S. Cl.
USPC .............. 702/104; 702/66; 702/67; 702/106; 324/121 R

(58) Field of Classification Search
USPC ................... 702/66, 67, 104, 106; 324/121 R
See application file for complete search history.

(56) References Cited

U.S. PATENT DOCUMENTS 4,758,963 A * 7/1988 Gordon et al. ................... 702/80
5,978,742 A * 11/1999 Pickerd ........................... 702/66

* cited by examiner

Primary Examiner — Jonathan C Teixeira Moffat
Assistant Examiner — Hien Vo
(74) Attorney, Agent, or Firm — Thomas F. Lenihan; Francis I. Gray; Marger, Johnson & McCollom, P.C.

(57) ABSTRACT

In a multi-channel oscilloscope a method of calibrating interleaved digitizer channels initially calibrates each digitizer channel to produce a bandwidth enhanced filter for each digitizer channel to match the respective channel frequency and phase characteristics. The oscilloscope is then configured for interleaved operation whereby an input signal is applied to at least two digitizers via a switch through a common preamplifier to produce a reference digitizer channel and an interleaved digitizer channel where the bandwidth enhanced filter for the interleaved digitizer channel is now not correct. Fast Fourier transforms are performed on the data from the reference digitizer channel and the interleaved digitizer channel, from which are derived a match filter for the interleaved digitizer channel so the interleaved digitizer channel and reference digitizer channel are matched in phase and magnitude at all frequencies.

8 Claims, 4 Drawing Sheets

METHOD OF CALIBRATING INTERLEAVED DIGITIZER CHANNELS

BACKGROUND OF THE INVENTION

The present invention relates to the field of calibration of test and measurement instruments, and in particular to an apparatus and method for calibration of interleaved digitizer channel signal paths that allow acquisition of data at very high sample rates while maintaining a phase and magnitude match between the interleaved signal paths at all frequencies.

In a modern four-channel digital storage oscilloscope, the channels are currently individually calibrated through a very time consuming process during manufacturing. When two or more of these channels are then interleaved for higher sample rates, the new signal paths required for an input signal have to be matched for an accurate interleave. The paths must match in both phase and magnitude at all frequencies. However, current methods for calibrating these channels require calibrated step generators, resulting in difficulty for obtaining good match at high frequencies.

What is desired is a method of calibrating interleaved digitizer channels that is easy, does not require calibrated step generators, and can be performed either in the field or in the factory.

BRIEF SUMMARY OF THE INVENTION

Accordingly, the present invention provides a method for more exactly matching interleaved channel paths for an input signal derived from respective digitizers by using one path that is calibrated conventionally with a bandwidth enhance filter as a reference channel, and then computing and applying an additional compensation filter for each additional interleaved path, making the interleaved path[s] substantially exactly match the reference channel. In this way a user may easily calibrate the interleaved path[s] on-the-fly by using a high speed, un-calibrated signal generator. The method requires no additional factory calibration of the oscilloscope. Alternatively, this method may be used in the manufacturing process. The method is particularly applicable where the channel path bandwidth is less than the Nyquist point of the base sample rate of the digitizers.

The advantages and novel features of the present invention are apparent from the following detailed description when read in conjunction with the appended claims and attached drawing figures.

DETAILED DESCRIPTION OF THE INVENTION

Figure 1:
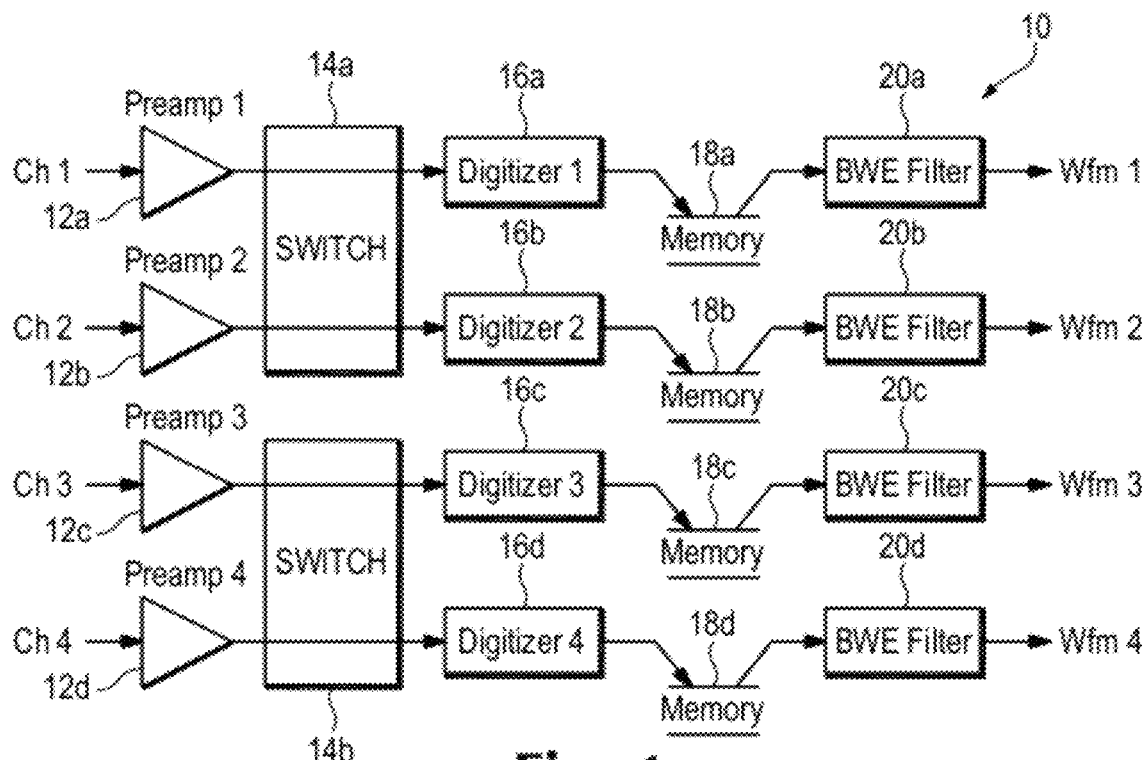
FIG. 1 is a diagrammatic view of the architecture of a standard four-channel oscilloscope, as known from the prior art.

The input stages 10 of a typical high performance digital storage oscilloscope, such as the DPO72004B digital storage oscilloscope manufactured by Tektronix, Inc., Beaverton, Oreg., having a 20 GHz bandwidth and using a sample rate of 50 GS/s on each of four channels, is shown in FIG. 1. Each channel has a preamplifier 12a, 12b, 12c, 12d (collectively, 12) having an input for receiving an input signal and an output. The output from the preamplifier 12 is input to a switch 14a, 14b, 14c, 14d (collectively, 14). The switch 14 may be a single switch having all preamplifier outputs as inputs and provide four channel outputs, or may be a pair of switches (as shown), one for the first two channels and the other for the remaining two channels. The outputs from the switch[es] 14 are input to respective digitizers 16a, 16b, 16c, 16d, (collectively, 16) the outputs of which are input to acquisition memory 18a, 18b, 18c, 18d (collectively, 18) as sample data for each channel. The outputs from the acquisition memory 18 are input to respective bandwidth enhance (BWE) filters 20a, 20b, 20c, 20d (collectively, 20) before being presented as waveform data (wfm) for display or further processing. The respective channel paths from the input of the preamplifiers 12 to the wfm outputs are factory-calibrated with the bandwidth enhance filters 20 to match the individual channel path frequency and phase characteristics of the respective preamplifier and digitizer paths.

Figure 2:
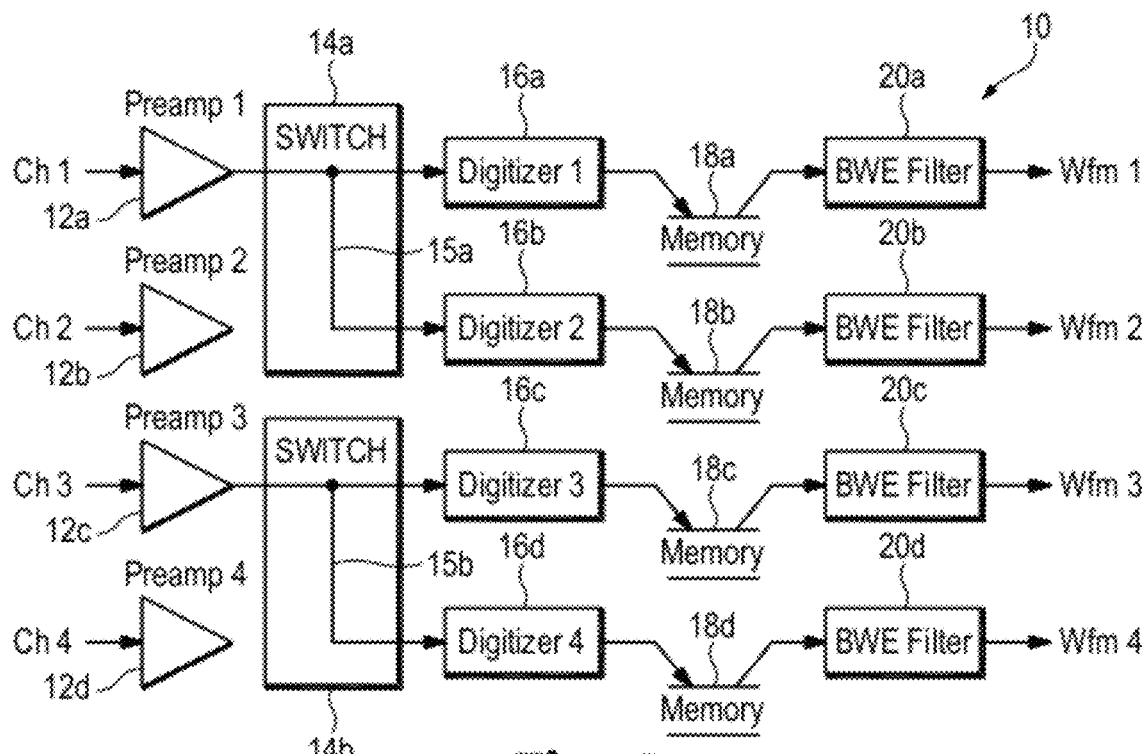
FIG. 2 is a diagrammatic view for the architecture of FIG. 1 setup for interleaving channels 1 and 2 and for interleaving channels 3 and 4, as known from the prior art.

However, when the interleave paths are switched-in, as shown in FIG. 2, the signal path from channel 1 input through the channel 2 digitizer 16b has not been calibrated at the factory. The same is true for the signal path from the input of channel 3 through the channel 4 digitizer 16d. In this illustrative example a sample rate of 100 GS/s is presumed, so only two channels have to be interleaved where the digitizers 16 have a sample rate of 50 GS/s.

The methodology of the present invention, as described below, does not require any further factory calibration to be performed in order to allow a customer to easily calibrate the new interleaved channel 2 and channel 4 paths to make them substantially exactly match the factory-calibrated channel 1 and channel 3 paths. In addition, the methodology does not require a calibrated signal generator, because the generator's response cancels from the mathematics to create the needed matching filters. It is recognized that the methodology described herein may also be used in a factory-calibrated version of interleave code that is built into the oscilloscope. However, the description below describes the methodology in the context of a software stand-alone application.

Referring again to FIG. 1, during manufacturing each channel is characterized and then the BWE filters 20 are created and stored in non-volatile read only memory (NVRAM). The BWE filters 20 correct the magnitude and phase of each channel over its bandwidth. Current state-of-the-art digital oscilloscopes use digitizers that provide 50-80 GS/s sample rates on each channel. The sample clocks for all four digitizers 16 are set to sample at the same point in time on each channel. For this example with a 50 GS/s sample rate, that provides a sample interval of twenty picoseconds (20 ps).

The track and hold switches 14 may be set as shown in FIG. 2 to provide a setup for 100 GS/s operation on two channels. For this illustration, the sample clocks for the channel 2 and 4 digitizers 16b, 16d are skewed to sample 10 ps later than the sample clocks for the channel 1 and 3 digitizers 16a, 16c. Then, after the waveforms have been stored in the acquisition memory 18, digitized samples may be interleaved between channels1 and 2 to obtain a 100 GS/s waveform.

Figure 3:
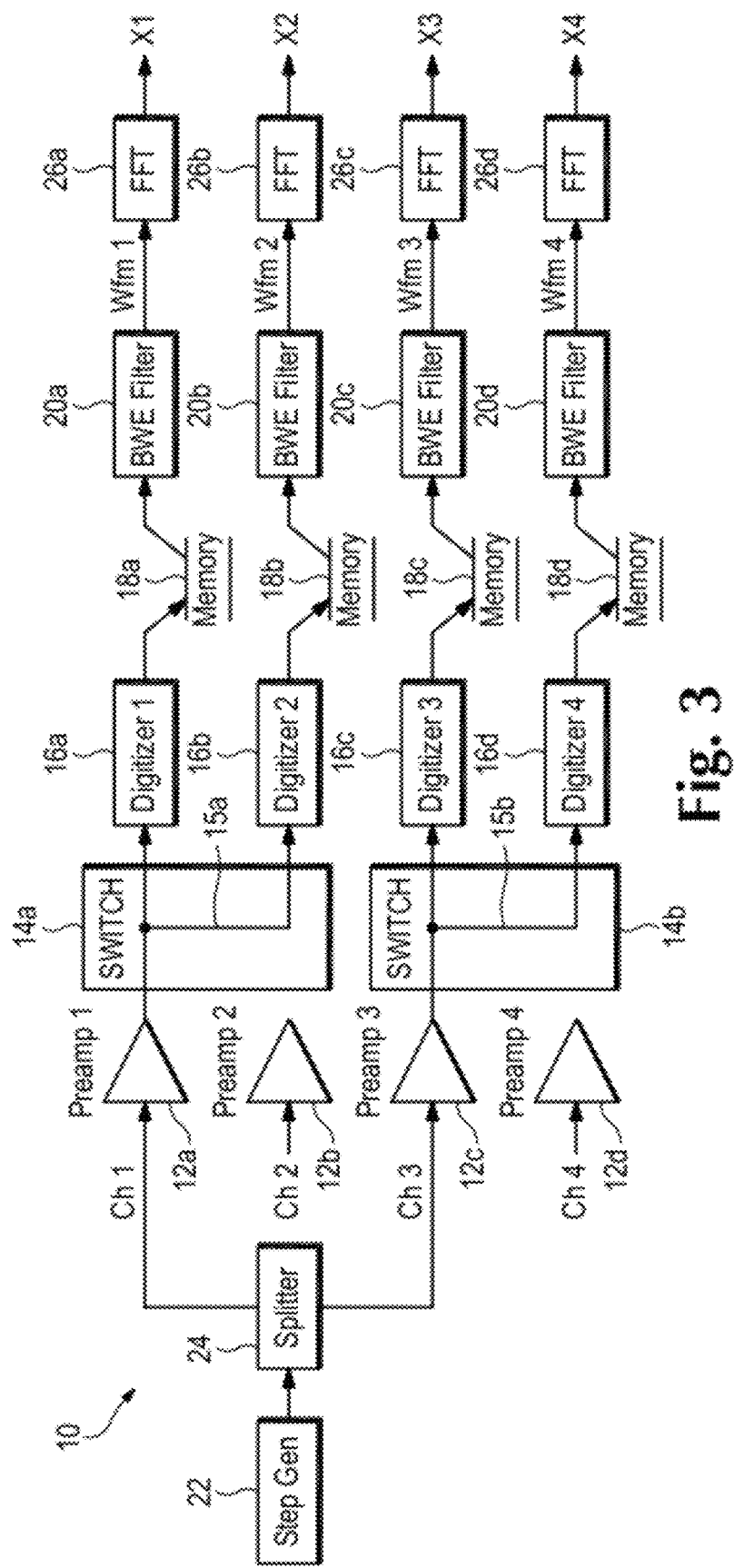
FIG. 3 is a diagrammatic view for calibrating interleaved digitizer paths according to the present invention.

Initially a standard oscilloscope calibration is performed as in the prior art with the oscilloscope configured as shown in FIG. 1, using manufacturing calibration constants, to produce the respective BWE filters 20 for each channel. Waveforms are captured at the base sample rate (50 GS/s in this illustration) and with a large number of averages, such as 4000. Then the oscilloscope is configured as shown in FIG. 3, with an un-calibrated step generator 22 coupled through a power splitter 24 to the input terminals of channels 1 and 3 so that both channels may be calibrated simultaneously. Now channel 1 is connected to both the channel 1 and 2 digitizers 16a, 16b through the appropriate switch 14a. Likewise, channel 3 is connected to channel 3 and 4 digitizers 16c, 16d through the appropriate switch 14c. BWE filters 20a, 20c are applied to each respective digitized waveform from the memory 18 to correct the phase and magnitude response of channels 1 and 3, which become reference channels. However, the respective BWE filters 20b, 20d for each of channels 2 and 4, the interleaved channels, now are not exactly correct, i.e., do not match the phase and frequency characteristics of corresponding channels 1 and 3. These two interleaved channels are corrected as described below.

A Fast Fourier Transform (FFT) 26 is computed for each digitized waveform at the output of the respective BWE filters 20. A search is performed for the largest harmonic frequency greater than 2 GHz, or some other predetermined value. The frequency chosen is such that the delay between channels to be measured is not greater than one-half the period. This is necessary so that the phase may be correctly unwrapped. The phase is computed at the selected frequency from the FFT data for channel 1 to be p1, and for channel 2 to be p2. The phase is unwrapped by assigning p2=p2−p1 and then setting p1=0. Then the phase angle is converted into time t1 to obtain the time delay between channels 1 and 2. The same procedure is repeated for channels 3 and 4 to obtain t3, the time delay between channels 3 and 4.

The values of t1 and t3 are used to control the time delay between the sample clocks of the digitizers 16 so that the sample clock of channel 2 is delayed for 10 ps with respect to channel 1. Likewise, clock delays are set so that the sample clock of channel 4 is delayed by 10 ps from the sample clock of channel 3.

The DC offset of the paths of channels 2 and 4 are measured (Offset2 and Offset4). This may be done by removing the step generator 22 and measuring wfm2 and wfm4. A filter $28_1$ (Filter2) is then computed that, when applied to the waveform of channel 2 (Ch2 wfm), has substantially exactly the same response as a waveform of channel 1 (Ch1 wfm). Another filter $28_2$ (filter4) is computed that, when applied to a waveform of channel 4 (wfm4), has substantially exactly the same response as a waveform of channel 3 (wfm3).

$$Filter2=IFFT(LPF*X1/X2)$$

where LPF is the FFT of a lowpass filter response to insure a large attenuation in the stop band of the final result. Likewise, $$Filter4=IFFT(LPF*X3/X4).$$

Filter2 and Filter4 correct the scaling magnitude and phase of the waveforms. Offset2 and Offset4 are first subtracted from them prior to applying the filters 28.

Figure 4:
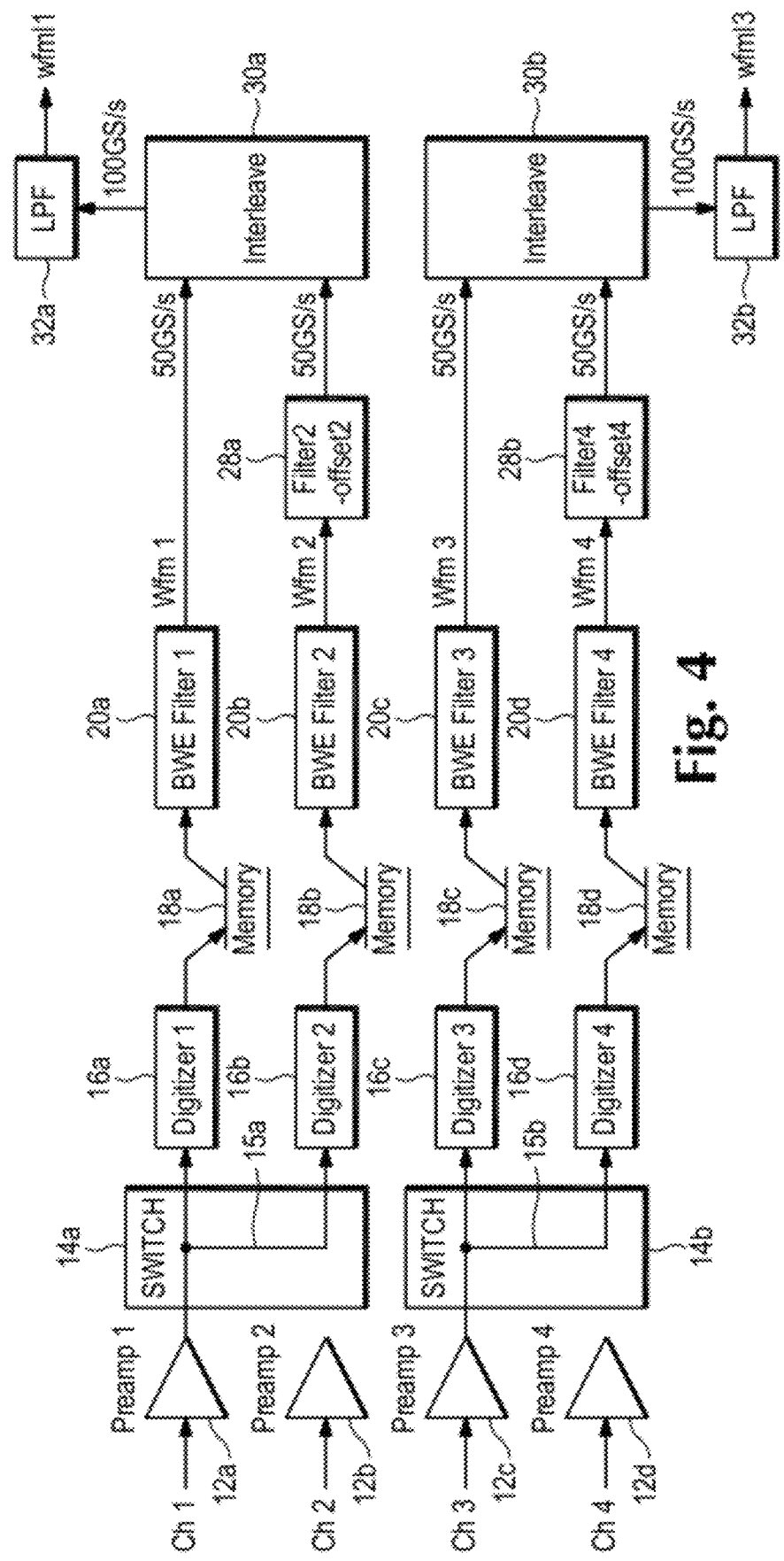
FIG. 4 is a diagrammatic view illustrating how filters are applied according to the present invention.

FIG. 4 illustrates how the filters 28a, 28b and interleave operations 30a, 30b are performed upon each acquired waveform set during real time operation of the acquisition system. Each BWE filter 20 is specifically calibrated for each of channels 1 through 4. However, in this configuration the BWE filters for channels 2 and 4 are not really the correct filters for this 2-way connection. The BWE filters for channels 1 and 3 are the correct filters for those channels. Thus, it is optional whether the system is calibrated with channel BWE filters for channels 2 and 4 turned on. However, in the oscilloscope these filters are also combined with a probe filter, if one is in use, and also with a lowpass filter, if the user has selected it from a menu. For this reason, these filters are included in FIG. 4.

The bandwidth of the oscilloscope channel (20 GHz in this example) is less than the Nyquist point of the base sample rate (50 GS/s) of the digitizers 16. Therefore, it is possible to apply a final filter 32a, 32b (LPF) at the 100 GS/s rate. The low pass filter (LPF) exhibits a cutoff frequency which is slightly greater than the bandwidth of the channel. Thus, any small mismatch of channels in the final waveform, wfmi, is smoothed out by this filter. One skilled in the art will recognize that the LPF filter 32 provides a significant amount of high frequency noise attenuation. This LPF could be applied to the 50 GS/s waveforms prior to the interleave function. Thus, the cutoff frequency is less that 25 GHz for a 50 GS/s system; likely around 22 GHz for the 20 GHz bandwidth channel.

If the bandwidth of the channel is greater than the base sample rate Nyquist point, then the LPF filter is not applied in the equations for computing Filter2 and Filter4, and the present methodology is not applicable.

The interleave operation tends to spread the noise at base sample rate out over twice the spectrum bandwidth. Thus, application of the final LPF filter 32 reduces noise.

Figure 5:
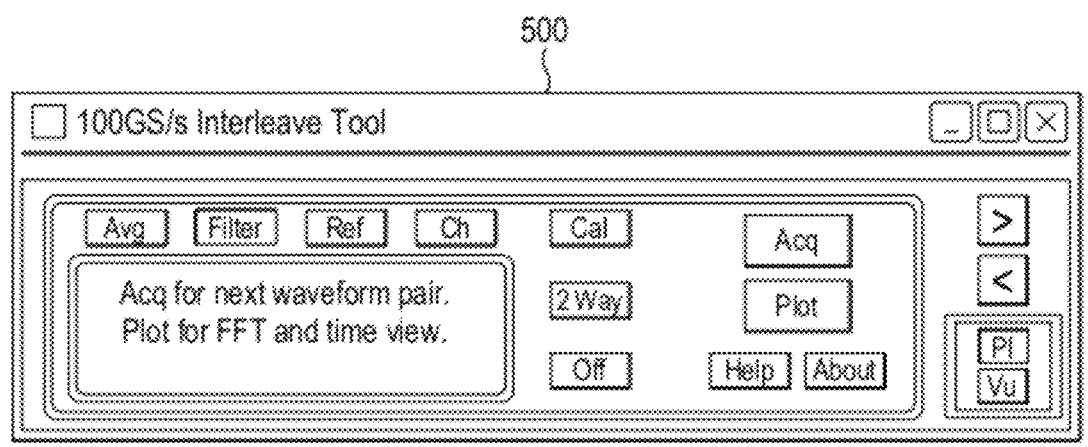
FIG. 5 is a screen display of a menu for an illustrative 100 GS/s Interleave software tool according to the present invention.

The following is an example of a Matlab software application for a 100 GS/s Interleave Tool. The menu is shown in FIG. 5 and represents a prototype interleave control system, as described above. It runs on the oscilloscope and controls the oscilloscope through a VISA interface using GPIB commands. It can set the scope track-and-hold switches 14 to 2-way by using GPIB commands.

The Calibration menu leads the user through a complete calibration procedure, which creates the filters 28 needed for the interleaved channels and also calibrates the digitizer clock skew. Pressing the Acq (Acquisition) button, after calibration has occurred, captures the waveforms, and performs the digital signal processing (DSP) as shown in FIG. 4, and returns the wfmi1 and wfmi3 waveforms into the reference 1 (REF1) and reference 3 (REF3) "slots" of the oscilloscope. This application may be controlled, through the GPIB system of the scope, to acquire an interleaved waveform.

Thus, the present invention provides a method of calibrating interleaved digitizer channels by initially conventionally calibrating BWE filters for each channel, and then computing match filters for the interleaved paths based upon FFTs for each channel waveform output to produce a substantially exact match with the corresponding reference path.

What is claimed is:

1. A method of calibrating interleaved digitizer channels for a multi-channel oscilloscope, each channel of the oscilloscope being of the type having a preamplifier for receiving an input signal and a digitizer for outputting sampled data derived from the input signal, the sampled data representing a waveform and the preamplifier and digitizer being coupled in series through a switch to produce a channel path, comprising the steps of:

calibrating a bandwidth enhance filter for the output of each channel path to compensate for frequency and phase characteristics;

configuring the switch to an interleaved mode such that the input signal applied to the preamplifier of one channel is applied to the digitizer for that channel to produce a reference digitizer channel path and to a digitizer of another channel to form an interleaved digitizer channel path;

computing a match filter for the interleaved digitizer channel path based upon fast Fourier transforms performed on the outputs of the corresponding bandwidth enhance filters for the reference digitizer channel path and for the interleaved digitizer channel path so the output of the interleaved digitizer channel path matches the output of the reference digitizer channel path in phase and magnitude at all frequencies when the match filter is applied to the output of the interleaved digitizer channel path;

performing a fast Fourier transform on the outputs of the reference digitizer channel path and the interleaved digitizer channel path after application of the respective bandwidth enhance filters to determine a phase angle between the reference and interleaved digitizer channel paths at a largest harmonic greater than a predetermined frequency value; and converting the phase angle into a time value for delaying a sample clock for the digitizer for the reference digitizer channel path to become a delayed sample clock for the digitizer for the interleaved digitizer channel path.

2. The method as recited in claim 1 further comprising the step of interleaving the outputs from the reference digitizer channel path and the interleaved digitizer channel path to form an interleaved waveform.

3. The method as recited in claim 1 wherein the computing step comprises the steps of:

applying an uncalibrated signal generator output to the input of the preamplifier for the reference digitizer channel path; and computing the match filter as Filter=IFFT(LPF*X1/X2) where LPF is a fast Fourier transform of a lowpass filter response.

4. The method as recited in claim 3 further comprising the steps of:

measuring a DC offset of the interleaved digitizer channel path by removing the uncalibrated signal generator output from the input of the preamplifier and measuring a waveform output from the interleaved digitizer channel path; and subtracting the DC offset from the Filter prior to applying the match filter to the output of the interleaved digitizer channel path.

5. An improved method of calibrating interleaved digitizer channels for a multi-channel test and measurement instrument of the type where each channel of the oscilloscope has a preamplifier for receiving an input signal coupled in series via a switch to a digitizer for producing data samples representing a waveform, the outputs from each digitizer being calibrated using manufacturer calibration constants to produce a bandwidth enhance filter for each channel that correct the magnitude and phase characteristics over the bandwidth of each channel, the improved method comprising the steps of:

configuring the switch to an interleaved mode such that the input signal applied through the preamplifier for one channel is applied to the digitizer for that channel to produce a reference digitizer channel path and to the digitizer of another channel to produce an interleaved digitizer channel path;

computing a match filter for the interleaved digitizer channel path based upon fast Fourier transforms performed on the outputs of the corresponding waveforms for the reference and interleaved digitizer channel paths so the output of the interleaved digitizer channel path matches the output of the reference digitizer channel path in phase and magnitude at all frequencies when the compensation filter is applied to the output of the interleaved digitizer channel path;

performing a fast Fourier transform on the outputs of the reference digitizer channel path and the interleaved digitizer channel path after application of the respective bandwidth enhance filters to determine a phase angle between the reference and interleaved digitizer channel paths at a largest harmonic greater than a predetermined frequency value; and converting the phase angle into a time value for delaying a sample clock for the digitizer for the reference digitizer channel path to become a delayed sample clock for the digitizer for the interleaved digitizer channel path.

6. The method as recited in claim 5 further comprising the step of interleaving the outputs from the reference digitizer channel path and the interleaved digitizer channel path to form an interleaved waveform.

7. The method as recited in claim 5 wherein the computing step comprises the steps of:

applying an uncalibrated signal generator output to the input of the preamplifier for the reference digitizer channel path; and computing the match filter as Filter=IFFT(LPF*X1/X2) where LPF is a fast Fourier transform of a lowpass filter response.

8. The method as recited in claim 7 further comprising the steps of:

measuring a DC offset of the interleaved digitizer channel path by removing the uncalibrated signal generator output from the input of the preamplifier and measuring a waveform output from the interleaved digitizer channel path; and subtracting the DC offset from the Filter prior to applying the match filter to the output of the interleaved digitizer channel path.

* * * * *